United States Patent
Okajima et al.

(10) Patent No.: US 6,867,120 B2
(45) Date of Patent: Mar. 15, 2005

(54) METHOD OF FABRICATING A SEMICONDUCTOR DEVICE WITH A GOLD CONDUCTIVE LAYER AND ORGANIC INSULATING LAYER

(75) Inventors: Takehiko Okajima, Tokyo (JP); Masahisa Ikeya, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 22 days.

(21) Appl. No.: 10/353,028

(22) Filed: Jan. 29, 2003

(65) Prior Publication Data

US 2004/0018744 A1 Jan. 29, 2004

(30) Foreign Application Priority Data

Jul. 26, 2002 (JP) ........................................ 2002/218426

(51) Int. Cl.[7] ................................................ H01L 21/28
(52) U.S. Cl. ...................... 438/602; 438/604; 438/605; 438/637; 438/906
(58) Field of Search ................................ 438/602, 604, 438/605, 637, 906

(56) References Cited

U.S. PATENT DOCUMENTS

| | | | | |
|---|---|---|---|---|
| 3,649,882 A | * | 3/1972 | Hoffman et al. ............... | 257/47 |
| 5,106,771 A | * | 4/1992 | Emerson et al. .............. | 438/573 |
| 6,043,518 A | * | 3/2000 | Hsu et al. .................... | 257/192 |
| 6,162,878 A | * | 12/2000 | Osada et al. ................. | 525/481 |
| 6,187,615 B1 | * | 2/2001 | Kim et al. ................... | 438/113 |
| 6,225,698 B1 | * | 5/2001 | Tang ........................... | 257/774 |
| 6,300,234 B1 | * | 10/2001 | Flynn et al. ................. | 438/612 |
| 6,333,268 B1 | * | 12/2001 | Starov et al. ................ | 438/691 |
| 6,492,198 B2 | * | 12/2002 | Hwang ........................ | 438/108 |
| 2002/0020855 A1 | * | 2/2002 | Hwang ........................ | 257/200 |
| 2003/0153172 A1 | * | 8/2003 | Yajima et al. .............. | 438/612 |
| 2004/0000712 A1 | * | 1/2004 | Wilson et al. .............. | 257/712 |

FOREIGN PATENT DOCUMENTS

JP        08-213380        8/1996

OTHER PUBLICATIONS

Ren et al., Improvement of ohmic contacts on GaAs with in situ cleaning, *Appl. Phys. Lett.*, 58 (Mar. 1991) 1030.*
Kim et al., Low resistance Pd/Au ohmic contacts to p–type GaN using surface treatment, *Appl. Phys. Lett.*, 73 (Nov. 1998) 2953.*
Kang et al., Surface preparation and effective contact formation for GaAs surface, *Vacuum*, 67 (2002) 91.*
Kniffin et al., The effect of aqueous chemical cleaning procedures on Schottky contacts to n–type GaAs, *Mat. Res. Soc. Symp. Proc.*, 181 (1990) 565.*

* cited by examiner

*Primary Examiner*—Richard Elms
*Assistant Examiner*—Christian D. Wilson
(74) *Attorney, Agent, or Firm*—Volentine Francos & Whitt P.L.L.C.

(57) ABSTRACT

In a semiconductor device, particles are removed from the surface of a gold conductive layer before an intermediate insulating layer of an amino silane compound is formed. An organic insulating layer is formed on the intermediate insulating layer. As a result, adhesion strength between the conductive layer and the intermediate insulating layer can be improved.

15 Claims, 6 Drawing Sheets

METHOD OF FABRICATING A SEMICONDUCTOR DEVICE WITH A GOLD CONDUCTIVE LAYER AND ORGANIC INSULATING LAYER

CROSS-REFERENCE TO RELATED APPLICATION

The present application claiming priority under 35 U.S.C. §119 to Japanese Application No. 2002-218426 filed on Jul. 26, 2002 which is hereby incorporated by reference in its entirely for all purposes.

BACKGROUND OF THE INVENTION

1. Field of the Invention

The present invention relates to a method for fabricating a semiconductor device which has an organic insulating layer formed on a conductive layer, which is comprised of gold.

2. Description of the Related Art

In a method for fabricating a semiconductor process, an intermediate insulating layer which is comprised of an amino silane compound is formed between a gold conductive layer and an organic insulating layer, such as polyimide to adhere therebetween.

Such method is disclosed in the co-owned Japanese patent application, Japanese Laid-Open Patent Publication: HEI 8-213380, published on Aug. 20, 1998.

SUMMARY OF THE INVENTION

In a preferred embodiment of the invention, particles are removed from a surface of a conductive layer which is comprised of gold before forming an intermediate insulating layer of an amino silane compound.

As a result, adhesion strength between the conductive layer and the intermediate insulating layer can be improved.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DESCRIPTION OF THE PREFERRED EMBODIMENTS

The present invention will be described hereinafter with reference to the accompanying drawings. The drawings used for this description typically illustrate major characteristic parts in order that the present invention will be easily understood. In this description, one embodiment is shown in which the present invention is applied to a semiconductor device including a gold conductive layer and an organic insulating layer.

Figure 1:
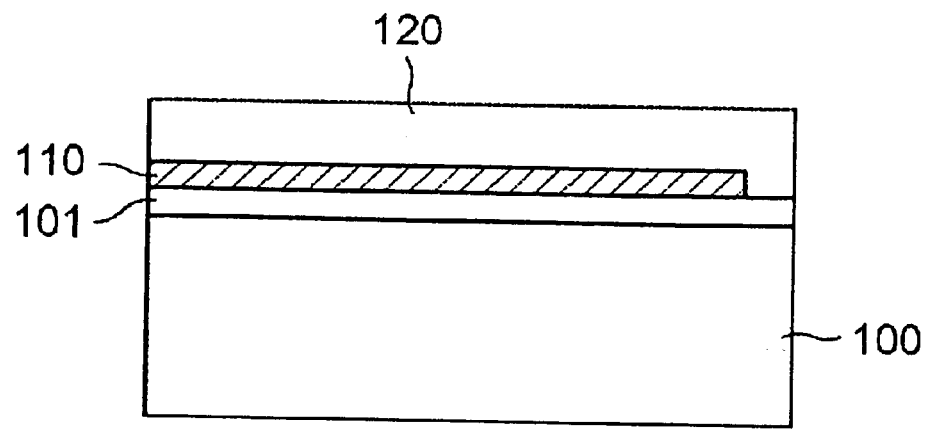
FIG. 1–FIG. 8 are partial cross-sectional views describing a method of fabricating a semiconductor device according to a preferred embodiment.

In FIG. 1, a silicon nitride layer 110 is formed on a surface of a semiconductor substrate 100. A gallium arsenic substrate (GaAs substrate), an indium phosphorus substrate (InP substare) or a silicon substrate can be used for the semiconductor substrate 100. In this preferred embodiment, a GaAs substrate is used for the substrate 100.

A first conductive layer 110 is formed on a predetermined region of the silicon nitride layer 101, as shown in FIG. 1. An intermediate insulating layer 120 is formed on the first conductive layer 110 and the silicon nitride layer 101. The first conductive layer 110 is comprised of gold (Au). The intermediate insulating layer 120 is comprised of a polyimide layer, which is formed by heating a precursor of polyimide formed on the first conductive layer 110 at a temperature of 350° C. for 30 minutes.

A contact hole 200 is selectively formed in the intermediate insulating layer 120 so as to expose a portion of the first conductive layer 110 for electrically connecting between the first conductive layer 110 and a second conductive layer 140 (described hereinafter), as shown as FIG. 2, or to expose a portion of the semiconductor substrate 100 for electrically connecting between the second conductive layer 140 and the semiconductor substrate 100. The contact hole 200 is formed by a conventional photolithography and dry etching techniques using a stepper system and a reactive ion etching system or an electron cyclotron resonance system.

An interior surface 203 of the contact hole 200 is defined by the side surfaces 201 and a bottom surface 202.

Figure 2:
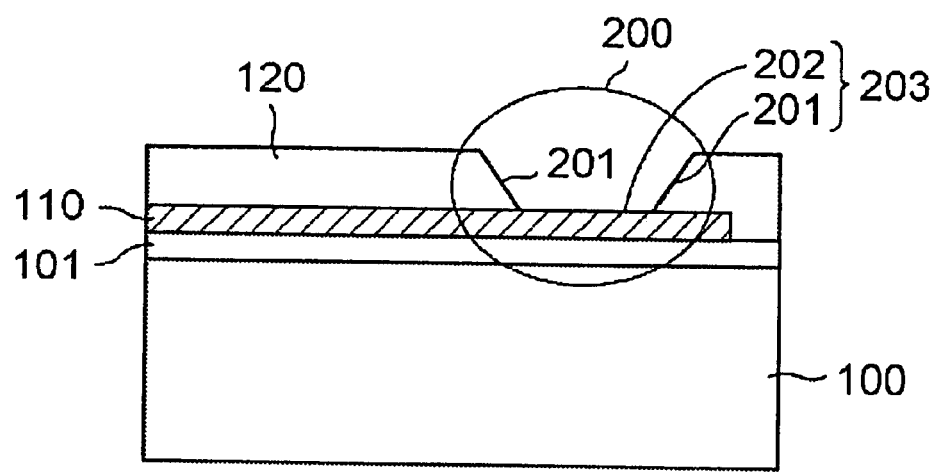

The side surfaces 201 of the contact hole 200 are oblique at an angle θ to an axis which is perpendicular to a surface of the semiconductor substrate 100, as shown in FIG. 2. In other words, the intermediate insulating layer 120 has a taper configuration which is defined by the side surfaces 201 of the contact hole 200. The oblique side surfaces 201 enable to deposit an upper metallic layer (described hereinafter) on the side surfaces 201 precisely. In this preferred embodiment, the angle θ is set to a range of 60–80 degrees for precisely deposition of the upper metallic layer.

Figure 3:
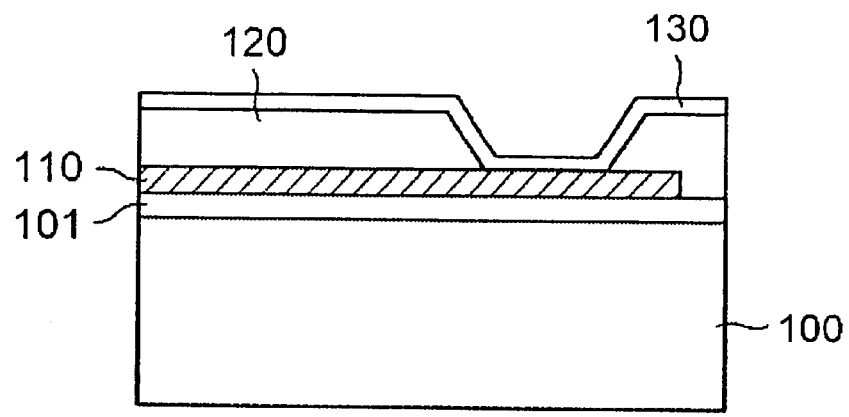

Next, a metallic layer 130 for an electrode of plating is formed on the intermediate insulating layer 120 and the interior surface 203 of the contact hole 200, as shown in FIG. 3. The metallic layer 130 is designated as a current film. The metallic layer 130 is a multi stacked layer which is comprised of titanium (Ti), platinum (Pt) and gold (Au). Each layer has a predetermined thickness and are formed by an EB vapour deposition system or a sputtering system. In this preferred embodiment, a titanium layer is formed on the intermediate insulating layer 120 and the interior surface 203 at a thickness of 500 Å, and a platinum layer is formed on the titanium layer at a thickness of 500 Å, and then a gold layer is formed on the platinum layer at a thickness of 1500 Å.

Figure 4:
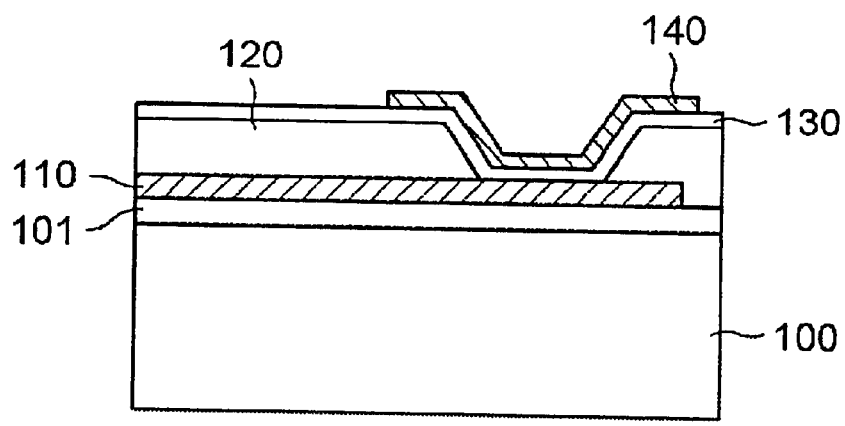

A resist layer (not shown) is formed on the metallic layer 130 and patterned so as to form predetermined conductive regions. Then, the conductive regions is plated with gold using the metallic layer 130 as a plate electrode to form a second conductive layer 140, as shown in FIG. 4.

Figure 5:
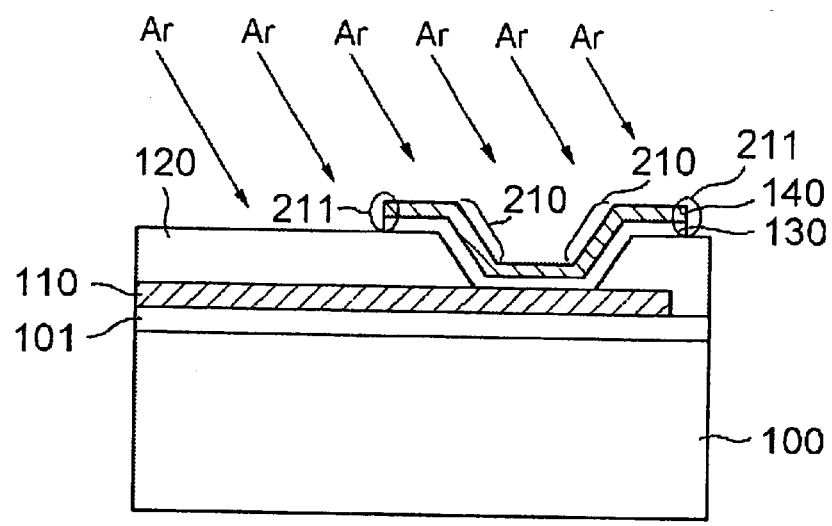

Portions of the metallic layer 130 are etched by an ion milling method using the second conductive layer 140 as a mask. In this preferred embodiment, from above the semiconductor substrate, argon ions (Ar+) are obliquely implanted to the second conductive layer 140 in order to remove the metallic layer 130 precisely, as shown in FIG. 5.

The second conductive layer 140 is electrically connected to the first conductive layer 110 through the contact hole 200. In the case where the contact hole is formed to expose a portion of the semiconductor substrate 100, the second conductive layer 140 is connected to the semiconductor substrate 100. The second conductive layer 140 is formed along the interior surface 203 of the contact hole 200. That is, a configuration of the second conductive layer 140 is reflected with the oblique or taper configuration of the contact hole 200.

If particles, such as metallic oxide adhere to a surface of the second conductive layer 140, adhesion strength between the second conductive layer 140 and an intermediate insulating layer 150 formed after may be reduced. According to the inventors of the present application, the reason why the adhesion strength reduces is that the particles prevent from forming a complex of the second conductive layer 140 and the intermediate insulating layer 150. The lower adhesion strength is, the stronger possibility of peeling between the second conductive layer 140 and the intermediate insulating layer 150.

Figure 6:
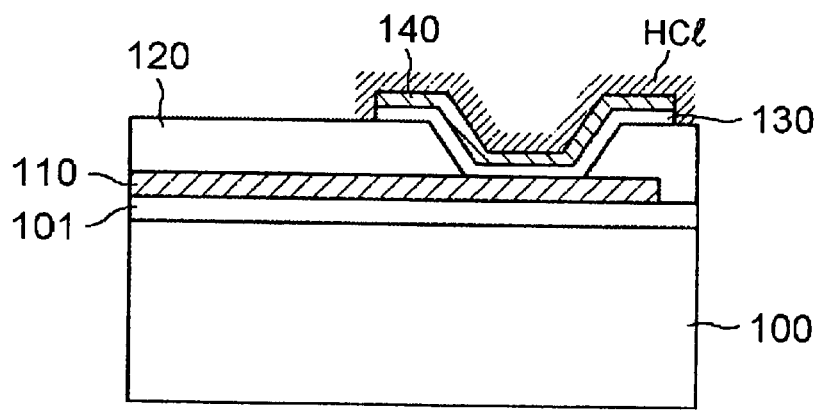

In this preferred embodiment, the particles are removed before forming the intermediate insulating layer 150. That is, the particles are removed by exposing the surface of the second conductive layer 140 to hydrochloric acid solution before the step of forming the insulating layer 150, as shown in FIG. 6. In this step, a semiconductor wafer on which a plurality of semiconductor devices each including the structure shown in FIG. 6 are formed, is immersed in a container holding the hydrochloric acid solution for a predetermined time. Then, the surface of the second conductive layer 140 is washed with water for removing the hydrochloric acid solution and is dried up by a dryer.

According to the inventor's view, it is preferable that the hydrochloric acid solution is diluted with water so as to cause a concentration of the hydrochloric acid solution to be equal to or more than one three hundredth ($\geq 1/300$). That is, the hydrochloric acid solution is mixed with water at the ratio of the hydrochloric acid solution to water is 1: (equal or less than 299). If the concentration of the hydrochloric acid solution is diluted with much water far beyond such range (300<<), it will take a lot of time to immerse the semiconductor wafer in the hydrochloric acid container. As a result, that cases production costs to be up.

Further, it is preferable that the semiconductor wafer is immersed in the hydrochloric acid container within one minute. If the wafer is immersed in the hydrochloric acid container over one minute, chlorine in the hydrochloric acid solution may remain on the second conductive layer 140 as a particle.

In this preferred embodiment, the hydrochloric acid solution is diluted with water so as to cause a concentration of the hydrochloric acid solution to be one thirtieth (1/30), and the semiconductor wafer is immersed in the hydrochloric acid container for thirty minutes. Thus, the particle, such as the metallic oxide on the second conductive layer 140, can be removed in a short time.

An aqua regia solution can be used in stead of the hydrochloric acid solution. According to the inventor's view, it is preferable that the aqua regia solution is diluted with water so as to cause a concentration of the aqua regia solution to be equal to or more than one tenth ($\geq 1/10$). That is, the aqua regia solution is mixed with water at the ratio of the aqua regia solution to water is 1: (equal or less than 10). If the concentration of the aqua regia solution is diluted with much water far beyond such range (10<<), it will take a lot of time to immerse the semiconductor wafer in the aqua regia container. As a result, that cases production costs to be up.

Further, it is preferable that the semiconductor wafer is immersed in the aqua regia container within one minute. If the wafer is immersed in the aqua regia container over one minute, the second conductive layer 140 may be etched beyond a permissible range.

In this another preferred embodiment, the aqua regia solution is diluted with water so as to cause a concentration of the aqua regia solution to be half (1/2), and the semiconductor wafer is immersed in the aqua regia container for twenty minutes. Thus, the particle, such as the metallic oxide on the second conductive layer 140, can be removed in a short time. Further, the second conductive layer 140 is not etched beyond the permissible-range.

The particles adhered to the surface of the second conductive layer 140 are mainly metallic oxide. The metallic oxide is caused by the ion implantation for etching the metallic layer 130. The ions for the etching the metallic layer 130, argon ions in this preferred embodiment, are supplied to the semiconductor substrate 100 with accelerated speed or slow downed speed defined by electrodes of an etching system for etching the metallic layer 130. Generally, the electrodes are comprised of iron (Fe).

If argon ions are impacted to the electrodes, several atoms of iron are expelled from the electrodes. The expelled atoms of iron reach to the surface of the second conductive layer 140 with the argon ions. The atoms of iron are oxidized into iron oxides, which adhere to the surface of the second conductive layer 140.

Particularly, the iron oxides are easy to adhere both on a bump portion 211 which is side surfaces of the second conductive layer 140 and on oblique portions 210 of the second conductive layer 140 which is positioned on the oblique side surfaces 201, as shown in FIG. 5. That is, the particles are easy to adhere on an oblique portion or a concave portion.

Figure 9A:
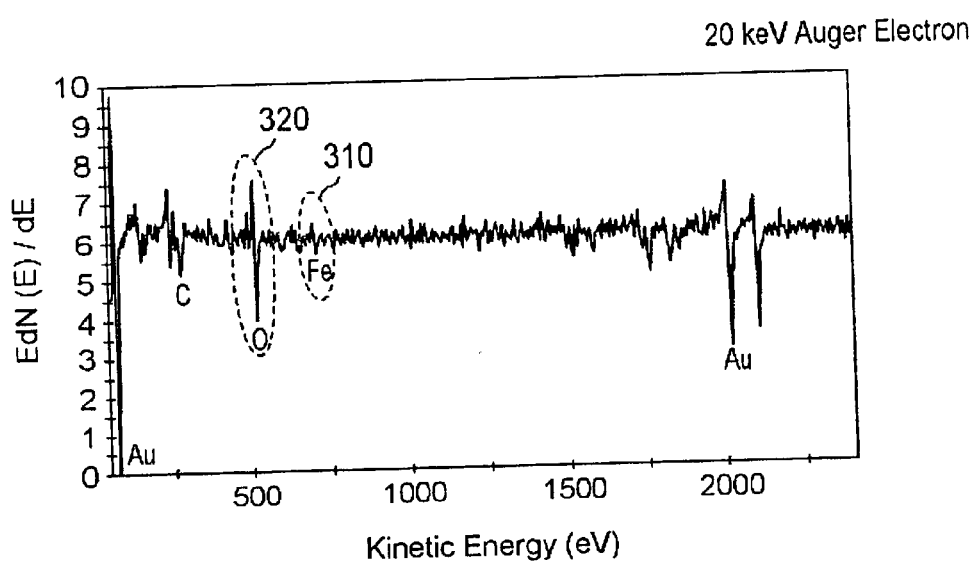
FIG. 9(a) and FIG. 9(b) are distributions of particles after implanting ions measured by Auger Electron Spectroscopy.
Figure 9B:
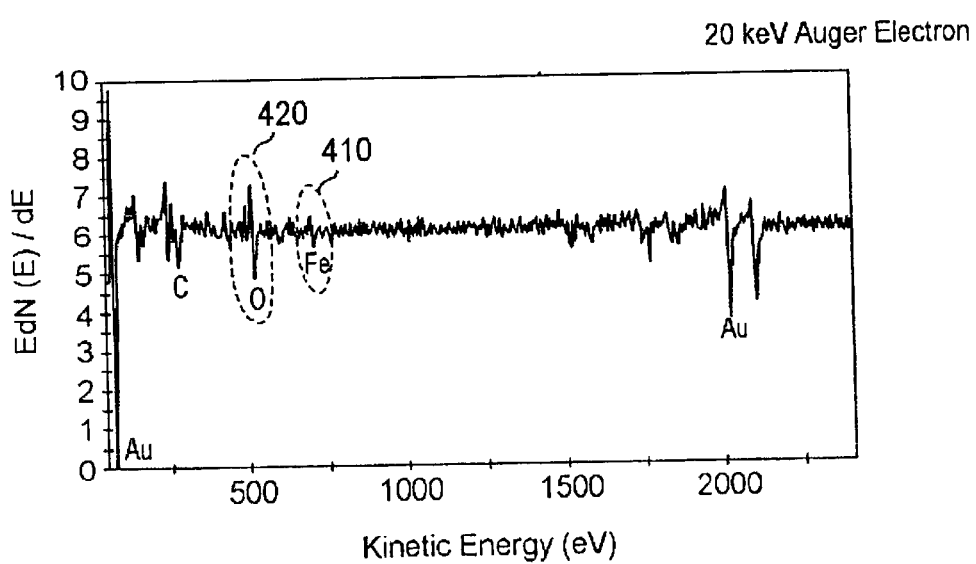

FIG. 9(a) and FIG. 9(b) are distributions of particles after implanting argon ions measured by Auger Electron Spectroscopy. In FIGS. 9(a) and 9(b), X-axes denote amount of kinetic energy, and Y-axes denote strength of detection.

FIG. 9(a) shows distribution of particles right after the ion implantation at the bump portion 211 of the second conductive layer 140. Similarly, FIG. 9(b) shows distribution of particles right after the ion implantation at the oblique portions 210 of the second conductive layer 140. Referring to FIGS. 9(a) and 9(b), peaks 310 and 410 at 750 eV of the Y-axes respectively denote existence of atoms of iron (Fe). Thus, adhesion of the atoms of iron to the bump portion 211 and the oblique portions 210 of the second conductive layer 140 can be recognized. Similarly, referring to FIGS. 9(a) and 9(b), peaks 320 and 420 at 500 eV of the Y axes respectively denote existence of atoms of oxygen (O). Thus, adhesion of the atoms of oxygen to the bump portion 211 and the oblique portions 210 of the second conductive layer 140 can be recognized. The metallic oxide (the particles) on the second conductive layer 140 is composed of the atoms of iron and oxygen.

Figure 10A:
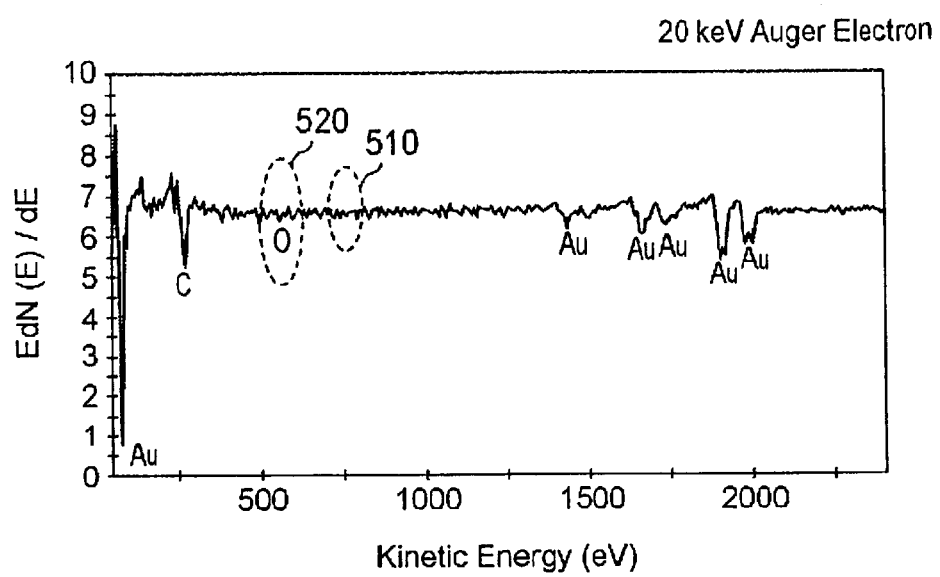
FIG. 10(a) and FIG. 10(b) are distributions of particles after removing particles measured by Auger Electron Spectroscopy.
Figure 10B:
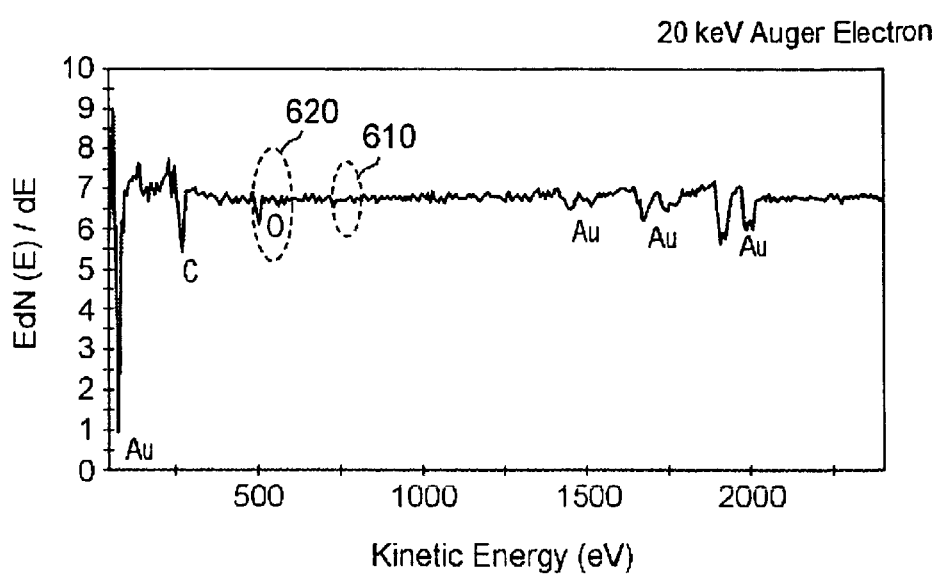

On the other hand, FIG. 10(a) and FIG. 10(b) are distributions of particles after treatment of the hydrochloric acid solution measured by Auger Electron Spectroscopy. Similar to FIGS. 9(a) and 9(b), X-axes denote amount of kinetic energy, and Y-axes denote strength of detection in FIGS. 10(a) and 10(b). FIG. 10(a) shows distribution of particles right after the treatment of the hydrochloric acid solution at the bump portion 211 of the second conductive layer 140. Similarly, FIG. 10(b) shows distribution of particles right after the treatment of the hydrochloric acid solution at the oblique portions 210 of the second conductive layer 140. Referring to FIGS. 10(a) and 10(b), peaks 510 and 610 at 750 eV of the Y-axes, which respectively denote existence of atoms of iron (Fe), the peaks are much smaller than that of FIGS. 9(a) and 9(b). Thus, the atoms of iron adhered to the bump portion 211 and the oblique portions 210 of the second conductive layer 140 can be reduced. That is, almost of the atoms of iron are removed by the treatment of the hydrochloric acid solution.

Similarly, referring to FIGS. 10(a) and 10(b), peaks 520 and 620 at 500 eV of the Y-axes respectively denote existence of atoms of oxygen (O). Thus, the atoms of oxygen adhered to the bump portion 211 and the oblique portions 210 of the second conductive layer 140 can be reduced. That is, almost of the atoms of oxygen are removed by the treatment of the hydrochloric acid solution.

Figure 7:
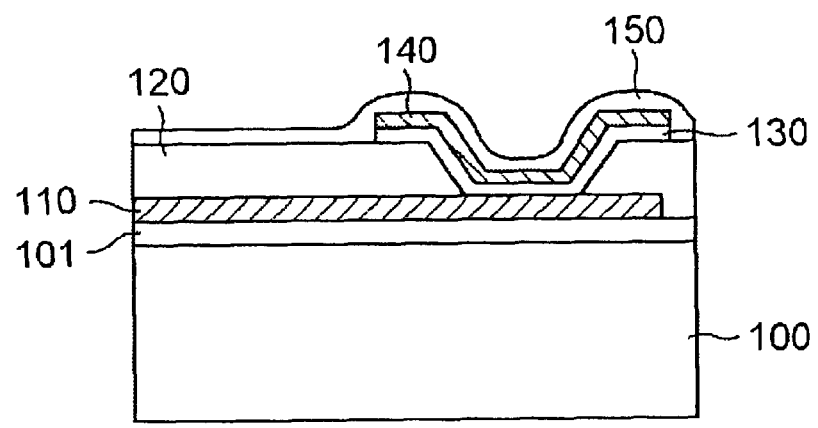
Figure 8:
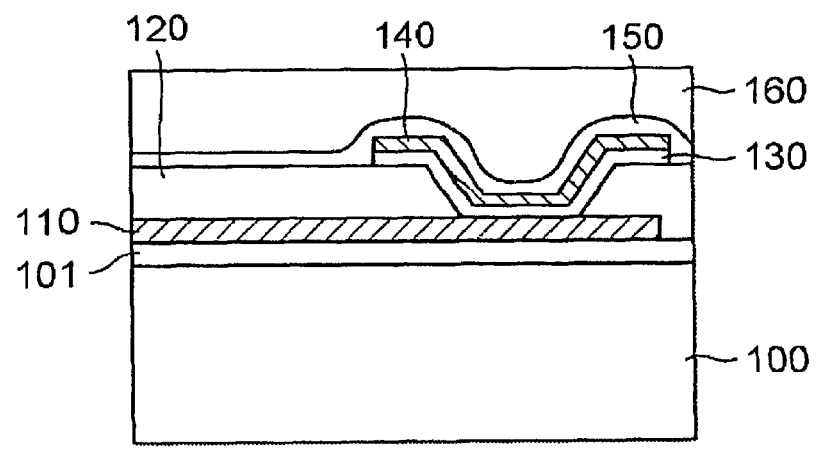

An intermediate insulating layer 150 is formed on the intermediate insulating layer 120 and the second conductive layer 140, as shown in FIG. 7. Then, the surface of the intermediate insulating layer 150 is washed with water and isopropyl alcohol (IPA) for cleaning the surface and is dried up by a dryer. Then, an organic insulating layer 160 which is comprised of polyimide.

The intermediate insulating layer 150 is used for adhesion of the second conductive layer 140 to the organic insulating layer 160. The intermediate insulating layer 150 can adhere to both the second conductive insulating layer 140 from which almost particles are removed, and the organic insulating layer 160.

The intermediate insulating layer 150 is formed by heating a precursor of amino silane compound which is formed on the second conductive layer 140. As a complex is formed by reacting the intermediate insulating layer 150 with the second conductive layer 140 by the heat treatment at an interface therebetween, the intermediate insulating layer 150 can be adhered to the second conductive layer 140 precisely. The precursor of amino silane compound is a solution of N-aminoalkyl-aminoalkyl(dimethoxyl)-methylsilane, N-aminoalkyl-aminoalkyl(dimethoxyl)-ethylsilane, N-aminoalkyl-aminoalkyl(diethoxyl)-methylsilane or N-aminoalkyl-aminoalkyl (diethoxyl)-ethylsilane and solvent of alcohol In this preferred embodiment, N-aminoalkyl-aminoalkyl (dimethoxyl)-methylsilane is used for the intermediate insulating layer 150. As cost of this compound is lower than that of other amino silane compound, it enables to reduce the production costs.

The organic insulating layer 160 is formed by heating a precursor of organic insulation compound which is formed on the insulating layer 150 at a temperature of 350° C. The precursor of organic insulation compound is dehydrated by the heat treatment. Thereby, bridging react occurs at an interface between the organic insulating layer 160 and the intermediate insulating layer 150. Therefore, the intermediate insulating layer 150 can be adhered to the organic insulating layer 160 precisely.

In this preferred embodiment, the particles on the second conductive layer 140 are removed before forming the intermediate insulating layer 150. That is, the particles are removed by exposing the surface of the second conductive layer 140 to hydrochloric acid solution or aqua gegia solution before forming the insulating layer 150.

Therefore, the intermediate insulating layer 150 can be adhered to the second conductive layer 140 precisely, besides the intermediate insulating layer 150 can be adhered to the organic insulating layer 160 precisely.

As a result, adhesion strength between the conductive layer and the intermediate insulating layer can be improved.

Particularly, as the iron oxides are easy to adhere both on the bump portion 211 and the oblique portions 210 of the second conductive layer 140 as described above, removing the particles on these portions intensively is effective.

The present invention is not limited to the structure having two conductive layers described in the preferred embodiment, and can be applied to a structure having multi conductive layers.

The present invention has been described above with reference to illustrative embodiments. However, this description must not be considered to be confined only to the embodiments illustrated. Various modifications and changes of these illustrative embodiments and the other embodiments of the present invention will become apparent to one skilled in the art from reference to the description of the present invention. It is therefore contemplated that the appended claims will cover any such modifications or embodiments as fall within the true scope of the invention.

What is claimed is:

1. A method for fabricating a semiconductor device, comprising:

removing particles from a surface of a conductive layer which is comprised of gold;

forming an intermediate insulating layer on the conductive layer, wherein the intermediate insulating layer is composed of an amino silane compound; and forming an organic insulating layer on the intermediate insulating layer.

2. The method according to claim 1, wherein the organic insulating layer and the conductive layer are joined with the intermediate insulating layer.

3. The method according to claim 1, wherein a concave portion is formed in the surface of the conductive layer.

4. The method according to claim 1, wherein the amino silane compound is N-aminoalkyl-aminoalkyl (dimethoxyl)-methylsilane.

5. The method according to claim 1, wherein the particles are comprised of metallic oxide.

6. The method according to claim 1, the step of removing including exposing the surface of the conductive layer to hydrochloric acid solution.

7. The method according to claim 6, wherein the hydrochloric acid solution is diluted with water so as to cause a concentration of the hydrochloric acid solution to be equal to or more than one three hundredth.

8. The method according to claim 1, the step of removing including exposing the surface of the conductive layer to an aqua regia solution.

9. The method according to claim 8, wherein the aqua regia solution is diluted with water so as to cause a concentration of the aqua regia solution to be equal to or more than one tenth.

10. A method for fabricating a semiconductor device, comprising:

forming a first conductive layer on a semiconductor substrate;

forming an insulating layer on the first conductive layer and the semiconductor substrate;

forming a contact hole in the insulating layer so as to expose either a portion of the first conductive layer or a portion of the semiconductor substrate;

forming a metallic layer on an upper surface of the insulating layer and an interior surface of the contact hole;

forming a second conductive layer on the metallic layer, wherein the second conductive layer is comprised of gold;

etching the metallic layer using the second conductive layer as a mask;

removing particles from a surface of the second conductive layer;

forming an intermediate insulating layer on the second conductive layer, wherein the intermediate insulating layer is composed of an amino silane compound; and forming an organic insulating layer on the intermediate insulating layer;

wherein the organic insulating layer and the second conductive layer are joined with the intermediate insulating layer.

11. The method according to claim 10, the step of etching including obliquely implanting ions to the semiconductor substrate.

12. The method according to claim 10, wherein the particles include iron oxide.

13. The method according to claim 10, the step of removing including exposing the second conductive layer to hydrochloric acid solution.

14. The method according to claim 13, wherein the hydrochloric acid solution is diluted with water so as to cause a concentration of the hydrochloric acid solution to be equal to or more than one three hundredth.

15. The method according to claim 10, wherein the amino silane compound is N-aminoalkyl-aminoalkyl (dimethoxyl)-methylsilane.

* * * * *